United States Patent [19]
Yoshikawa

[11] Patent Number: 5,844,837
[45] Date of Patent: Dec. 1, 1998

[54] STATIC MEMORY DEVICE INCLUDING SUPPLEMENTAL GATE CAPACITANCE

[75] Inventor: Sadao Yoshikawa, Gifu-ken, Japan

[73] Assignee: Sanyo Electric Co., Ltd., Osaka, Japan

[21] Appl. No.: 825,199

[22] Filed: Mar. 27, 1997

[30] Foreign Application Priority Data

Mar. 29, 1996 [JP] Japan .................................. 8-076818

[51] Int. Cl.⁶ .................................................. G11C 11/00
[52] U.S. Cl. .......................................... 365/156; 365/154
[58] Field of Search ..................................... 365/156, 154

[56] References Cited

U.S. PATENT DOCUMENTS

| | | | |
|---|---|---|---|
| 5,390,143 | 2/1995 | Manning | 265/145 |
| 5,404,326 | 4/1995 | Okamoto | 365/156 |
| 5,406,107 | 4/1995 | Yamaguchi | 257/393 |
| 5,469,065 | 11/1995 | Houston | 324/537 |
| 5,506,802 | 4/1996 | Kiyomo | 365/156 |
| 5,515,313 | 5/1996 | Yamaguchi | 365/156 |
| 5,523,966 | 6/1996 | Idei et al. | 365/156 |
| 5,536,960 | 7/1996 | Hayashi | 257/369 |
| 5,610,856 | 3/1997 | Yoshizumi et al. | 365/154 |

FOREIGN PATENT DOCUMENTS 8-097298 9/1994 Japan .

*Primary Examiner*—David C. Nelms
*Assistant Examiner*—Hien Nguyen
*Attorney, Agent, or Firm*—Sheridan, Ross, P.C.

[57] ABSTRACT

A static semiconductor memory device includes a semiconductor substrate, first and second load transistors located along a first power line, and first and second drive transistors located along a second power line. The device further includes first and second select transistors, a first connection line, a second connection line, and a capacitor. The first connection line is commonly connected a gate of the first load transistor and a gate of the first drive transistor to drains of the second load transistor, the second drive transistor and the first select transistor. The second connection line is commonly connected a gate of the second load transistor and a gate of the second drive transistor to drains of the first load transistor, the first drive transistor and the second select transistor. The capacitor is supplemented with at least one of the first connection line and the second connection line.

5 Claims, 4 Drawing Sheets

STATIC MEMORY DEVICE INCLUDING SUPPLEMENTAL GATE CAPACITANCE

BACKGROUND OF THE INVENTION

1. Field of the Invention

The present invention relates generally to a semiconductor memory device. More particularly, the invention relates to a static semiconductor memory device equipped with memory cells having a specific pattern.

2. Description of the Related Art

A static RAM (SRAM) has memory cells using flip-flops for storing data corresponding to "1" or "0". Each flip-flop includes an enhancement/depletion MOS (E/DMOS) inverter, a high-resistance load inverter or a CMOS inverter. Flip-flops that use a CMOS inverter are advantageous over the other types in that they consume less power.

FIG. 1 is a circuit diagram showing a memory cell of an SRAM, which uses CMOS inverters. The memory cell includes two CMOS inverters I1 and I2 and two select transistors S1 and S2. The CMOS inverter I1 includes a P channel MOS transistor P1 and an N channel MOS transistor N1, which are connected in series between a high-potential power supply and a low-potential power supply. The CMOS inverter I2 includes a P channel MOS transistor P2 and an N channel MOS transistor N2, which are connected in series between the high-potential power supply and the low-potential power supply.

The inverters I1 and I2 have cross-coupled input terminals and output terminals. The select transistors are connected via the inverters I1 and I2 between bit lines BL1 and BL2 and have gates connected to a common word line WL, respectively.

FIG. 2 is a plan view illustrating the structure of a memory cell formed on a semiconductor substrate in a conventional SRAM, and FIG. 3 is a cross-sectional view of the memory cell in FIG. 2 along the line 3—3.

As shown in FIG. 2, P channel MOS transistors (or load transistors) P1 and P2 in FIG. 1 are located on a semiconductor substrate 1 having an N-type conductivity, and a P-well region 2 having a P-type conductivity is defined on a predetermined region of the semiconductor substrate 1. Located on the P-well region 2 are N channel MOS transistors (or drive transistors) N1 and N2 and select transistors S1 and S2, both of which are shown in FIG. 1.

The P channel MOS transistor P1 has a first P-type impurity diffusion layer (hereinafter called "P-type diffusion layer") 11 as a source, a second P-type diffusion layer 12 as a drain and a first gate electrode 14. The P channel MOS transistor P2 has the first P-type impurity diffusion layer 11 as a source, which is shared by the transistor P1, a third P-type diffusion layer 13 as a drain, and a second gate electrode 15.

The N channel MOS transistor N1 has a first N-type impurity diffusion layer (hereinafter called "N-type diffusion layer") 16 as a drain, a second N-type diffusion layer 17 as a source, and a third gate electrode 18. The N channel MOS transistor N2 has a third N-type diffusion layer 19 as a drain, a fourth N-type diffusion layer 20 as a source and, a fourth gate electrode 21.

The select transistor S1 has the first diffusion layer 16 as a drain, which is shared by the transistor N1, a fifth N-type diffusion layer 22 as a source, and a fifth gate electrode 25. The select transistor S2 has a sixth N-type diffusion layer 23 as a drain, a seventh N-type diffusion layer 24 as a source, and the fifth gate electrode 25, which is shared by the transistor S1.

The first to third P-type diffusion layers 11–13, the first to sixth N-type diffusion layers 16, 17, 19, 20, 22 and 23, and the first to fifth gate electrodes 14, 15, 18, 21 and 25 form a device forming region. As shown in FIG. 3, the area of the semiconductor substrate 1 excluding the device forming region is covered with a relatively thick oxide insulation film 3, which is formed by selective oxidization. This insulation film 3 therefore serves to distinguish the device forming region from the non-device forming region.

The fifth gate electrode 25 serves as the word line WL of FIG. 1. Connected to the first P-type diffusion layer 11 (source) is an aluminum interconnection 33 as a power line. The aluminum interconnection 33 is located substantially in parallel to the word line WL. Connected to the second and fourth N-type diffusion layers 17 and 20 (sources) is an aluminum interconnection 40 as a ground line. The aluminum interconnection 40 is located substantially parallel to the word line WL (the fifth gate electrode 25). Aluminum interconnections 47 and 48 as bit lines are located perpendicular to the word line WL. The aluminum interconnections 47 and 48 are also respectively connected to the select transistors S1 and S2. Therefore, the power line and the ground line are not located along the bit lines. This structure reduces the distance between the bit lines, thus reducing the size of the memory cells.

The conventional SRAM of FIGS. 1–3 will be discussed below more specifically. In the P channel MOS transistors P1 and P2, the first P-type diffusion layer 11 is defined on the semiconductor substrate 1 along an imaginary line substantially parallel to the edge portion 2a of the P-well region 2. The second and third P-type diffusion layers 12 and 13 are defined on the semiconductor substrate 1 at a given distance from the first P-type diffusion layer 11. The first gate electrode 14 is located on an insulation film (not shown) over the semiconductor substrate 1 between the first and second P-type diffusion layers 11 and 12. The second gate electrode 15 is located on an insulation film over the semiconductor substrate 1 between the first and third P-type diffusion layers 11 and 13. The first to third P-type diffusion layers 11–13 are formed by injecting a P-type impurity in the device forming region on the semiconductor substrate 1. This injection is preferably carried out by a self-alignment technique using the first and second gate electrodes 14 and 15 as masks.

In the N channel MOS transistor N1, the first and second N-type diffusion layers 16 and 17 are defined on the P-well region 2 at a given distance from each other. The first and second N-type diffusion layers 16 and 17 are also defined in parallel in a direction inclined at about 45 degrees to the locating directions of the first and second P-type diffusion layers 11 and 12 (or the first and third P-type diffusion layers 11 and 13). The third gate electrode 18 is located on an insulation film over the P-well region 2 between the first and second N-type diffusion layers 16 and 17.

In the N channel MOS transistor N2, as shown in FIG. 3, the third and fourth N-type diffusion layers 19 and 20 are defined on the P-well region 2 at a given distance from each other and parallel to the first and second N-type diffusion layers 16 and 17. The fourth gate electrode 21 is located on an insulation film 4 over the P-well region 2 between the third and fourth N-type diffusion layers 19 and 20. The first to fourth N-type diffusion layers 16, 17, 19 and 20 are formed by injecting an N-type impurity in the device forming region on the P-well region 2. In this case, the third and fourth gate electrodes 18 and 21 are used as masks.

In the select transistors S1 and S2, the fifth N-type diffusion layer 22 is defined on the P-well region 2 at a given distance from the first N-type diffusion layer 16. The sixth and seventh N-type diffusion layers 23 and 24 are defined on the P-well region 2 at a given distance from each other and parallel to the first and fifth N-type diffusion layers 16 and 22. The fifth gate electrode 25 as the word line WL is located on an insulation film over the P-well region 2 between the first and fifth N-type diffusion layers 16 and 22 and between the sixth and seventh N-type diffusion layers 23 and 24. The sources and drains of the select transistors S1 and S2 may be reversed in accordance with the voltages to be applied to the bit lines BL1 and BL2.

The first and third gate electrodes 14 and 18 are connected together via a first connection portion 26. That is, the first and third gate electrodes 14 and 18 are formed integrally with the first connection portion 26. The first connection portion 26 has a relatively large area and is located over the third N-type diffusion layer 19. The first connection portion 26 is provided to connect the first and third gate electrodes 14 and 18 to the third N-type diffusion layer 19, or the drain of the N channel MOS transistor N2. As shown in FIGS. 2 and 3, the insulation film 4 has a first opening 27 through which the first connection portion 26 is communicatable with the third N-type diffusion layer 19. A buried contact 26a is formed in the first opening 27. This contact 26a permits the first connection portion 26 and the third N-type diffusion layer 19 to be connected together. The buried contact 26a is preferably formed of a buried layer, which has previously been formed in the first opening 27. It is preferable in this embodiment that the buried layer be doped with an N-type impurity.

The third gate electrode 18 has an extended portion extending over the sixth N-type diffusion layer 23 and a second connection portion 28 formed integrally with the distal end of that extended portion. The second connection portion 28 has a relatively large area and is formed over the sixth N-type diffusion layer 23. The second connection portion 28 is provided to connect the third gate electrode 18 to the sixth N-type diffusion layer 23, or the drain of the select transistor S2.

The insulation film 4 on the sixth N-type diffusion layer 23 has a second opening 29 through which the second connection portion 28 is communicatable with the sixth N-type diffusion layer 23. A buried contact (not shown) is formed in the second opening 29. This contact permits the second connection portion 28 and the sixth N-type diffusion layer 23 to be connected together.

The second and fourth gate electrodes 15 and 21 are connected together via a third connection portion 30. The third connection portion 30 has a relatively large area and is provided close to the second P-type diffusion layer 12. The third connection portion 30 is provided to connect the second and fourth gate electrodes 15 and 21 to a second aluminum interconnection 34 (which will be discussed later).

The fourth gate electrode 21 has an extended portion extending over the first N-type diffusion layer 16 and a fourth connection portion 31 formed integrally with the distal end of that extended portion. The fourth connection portion 31 has a relatively large area and is formed over the first N-type diffusion layer 16. The fourth connection portion 31 is provided to connect the fourth gate electrode 21 to the first N-type diffusion layer 16, or the drains of the N channel MOS transistor N1, and the select transistor S1.

The insulation film 4 on the first N-type diffusion layer 16 has a third opening 32 through which the fourth connection portion 31 is communicatable with the first N-type diffusion layer 16. A buried contact (not shown) is formed in the third opening 32. This contact permits the third connection portion 31 and the first N-type diffusion layer 16 to be connected together.

The first to fifth gate electrodes 14, 15, 18, 21 and 25 are formed in a layer comprising polycrystalline silicon. The first to sixth aluminum interconnections 33, 34, 37, 40, 43 and 44 are formed in a first conductivity layer. The first conductivity layer is located over the first to fifth gate electrodes 14, 15, 18, 21 and 25. The seventh and eighth aluminum interconnections 47 and 48 are formed in a second conductivity layer over a first conductivity layer. FIG. 3 shows the fourth aluminum interconnection 40 and the eighth aluminum interconnection 48.

The first aluminum interconnection 33 as the power line is located to overlie the first P-type diffusion layer 11 and is directly connected to the first P-type diffusion layer 11.

The second aluminum interconnection 34 is located on an insulation film (not shown) over the third P-type diffusion layer 13 and the third connection portion 30. The second aluminum interconnection 34 is provided to connect the drain of the P channel MOS transistor P1 to the gates of the P channel MOS transistor P2 and the N channel MOS transistor N2. Formed in the second aluminum interconnection 34 are two contact holes 35 and 36 through which the second P-type diffusion layer 12 and the third connection portion 30 are connected.

The third aluminum interconnection 37 is located on an insulation film 5 between the third P-type diffusion layer 13 and the first connection portion 26. The third aluminum interconnection 37 is provided to connect the drain of the P channel MOS transistor P2 to the gates of the P channel MOS transistor P1 and the N channel MOS transistor N1. FIG. 3 shows a part of the third aluminum interconnection 37. Formed in the third aluminum interconnection 37 are two contact holes 38 and 39 through which the third P-type diffusion layer 13 and the first connection portion 26 are connected.

The fourth aluminum interconnection 40 as the ground line is located on an insulation film (not shown) to be substantially parallel to the fifth gate electrode 25 and to run over the second and fourth N-type diffusion layers 17 and 20. The fourth aluminum interconnection 40 has two contact holes 41 and 42 through which the second N-type diffusion layer 17 and the fourth N-type diffusion layer 20 are connected.

The fifth aluminum interconnection 43 is located on an insulation film (not shown) over the fifth N-type diffusion layer 22. Formed in the fifth aluminum interconnection 43 is a contact hole 45 through which the fifth aluminum interconnection 43 is connected to the fifth N-type diffusion layer 22.

The sixth aluminum interconnection 44 is located on an insulation film (not shown) over the seventh N-type diffusion layer 24. Formed in the sixth aluminum interconnection 44 is a contact hole 46 through which the sixth aluminum interconnection 44 is connected to the seventh N-type diffusion layer 24.

The seventh and eighth aluminum interconnections 47 and 48, which form the pair of bit lines BL1 and BL2, are located on an insulation film 6 (see FIG. 3). The seventh and eighth aluminum interconnections 47 and 48 are also perpendicular to the first and fourth aluminum interconnections 33 and 40. The seventh and eighth aluminum interconnections 47 and 48 are further located to respectively overlie the fifth and sixth aluminum interconnections 43 and 44.

Respectively formed in the seventh and eighth aluminum interconnections 47 and 48 are contact holes 49 and 50 through which the seventh and eighth aluminum interconnections 47 and 48 are respectively connected to the fifth and sixth aluminum interconnections 43 and 44.

To increase the memory capacity of the SRAM having the aforementioned memory cells, it is essential to reduce the sizes of the transistors in each memory cell. This size reduction decreases the gate capacitance, or the diffusion capacitance, which reduces the capacitance of memory nodes. As a result, the stability of the storing and holding operation by the inverters I1 and I2 is disadvantageously degraded, thereby readily causing noise-induced potential inversion or so-called a soft error at the gate electrodes, or memory nodes in the memory cells.

SUMMARY OF THE INVENTION

Broadly speaking, the present invention relates to a semiconductor memory device that increases the capacitance of memory nodes while reducing the size of memory cells. The present invention can be implemented in numerous ways including as an apparatus and a method.

In one aspect of the invention, a static semiconductor memory device receives power from a first power line and a second power line located apart from each other. The device includes a semiconductor substrate, first and second load transistors located over the semiconductor substrate parallel to each other, along the first power line and connected to the first power line, and first and second drive transistors located over the semiconductor substrate parallel to each other, along the second power line and connected to the second power line. Each of the first and second load transistors has a gate and a drain, and each of the first and second drive transistors has a gate and a drain. The device further includes a pair of bit lines crossing the first and second power lines and running substantially parallel to each other, and first and second select transistors respectively connected to the pair of bit lines. Each of the first and second select transistors has a drain. The device yet includes a first connection line, a second connection line and a capacitor. The first connection line is commonly connected to the gate of the first load transistor and to the gate of the first drive transistor and to the drains of the second load transistor, the second drive transistor and the first select transistor. The second connection line is commonly connected to the gate of the second load transistor and to the gate of the second drive transistor to the drains of the first load transistor, and the first drive transistor and the second select transistor. The capacitor is supplemented with at least one of the first connection line and the second connection line.

The semiconductor substrate has a first region having a first conductivity and a second region having a second conductivity. The first and second load transistors are located over the first region. The first and second drive transistors are located over the second region. The capacitor is located at a boundary between the first region and the second region.

The semiconductor memory device further includes an insulation layer provided between the semiconductor substrate and at least one of the first and second connection lines. The capacitor is formed by the semiconductor substrate, the insulation layer and at least one of the first and second connection lines. The insulation layer preferably has a thickness sufficient for at least one of the first and second connection lines and the surface of the semiconductor substrate are close to each other.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

Figure 1:
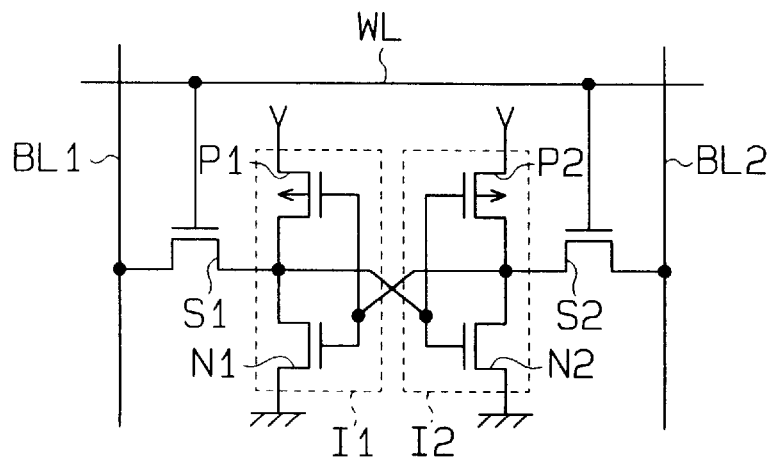
FIG. 1 is a circuit diagram of a memory cell of a conventional SRAM.
Figure 3:
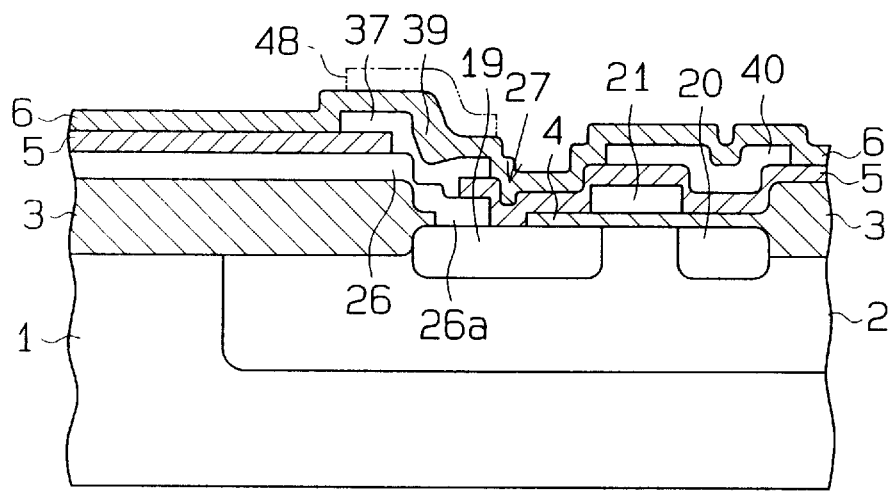
FIG. 3 is a cross-sectional view of the memory cell in FIG. 2 along the line 3—3.
Figure 2:
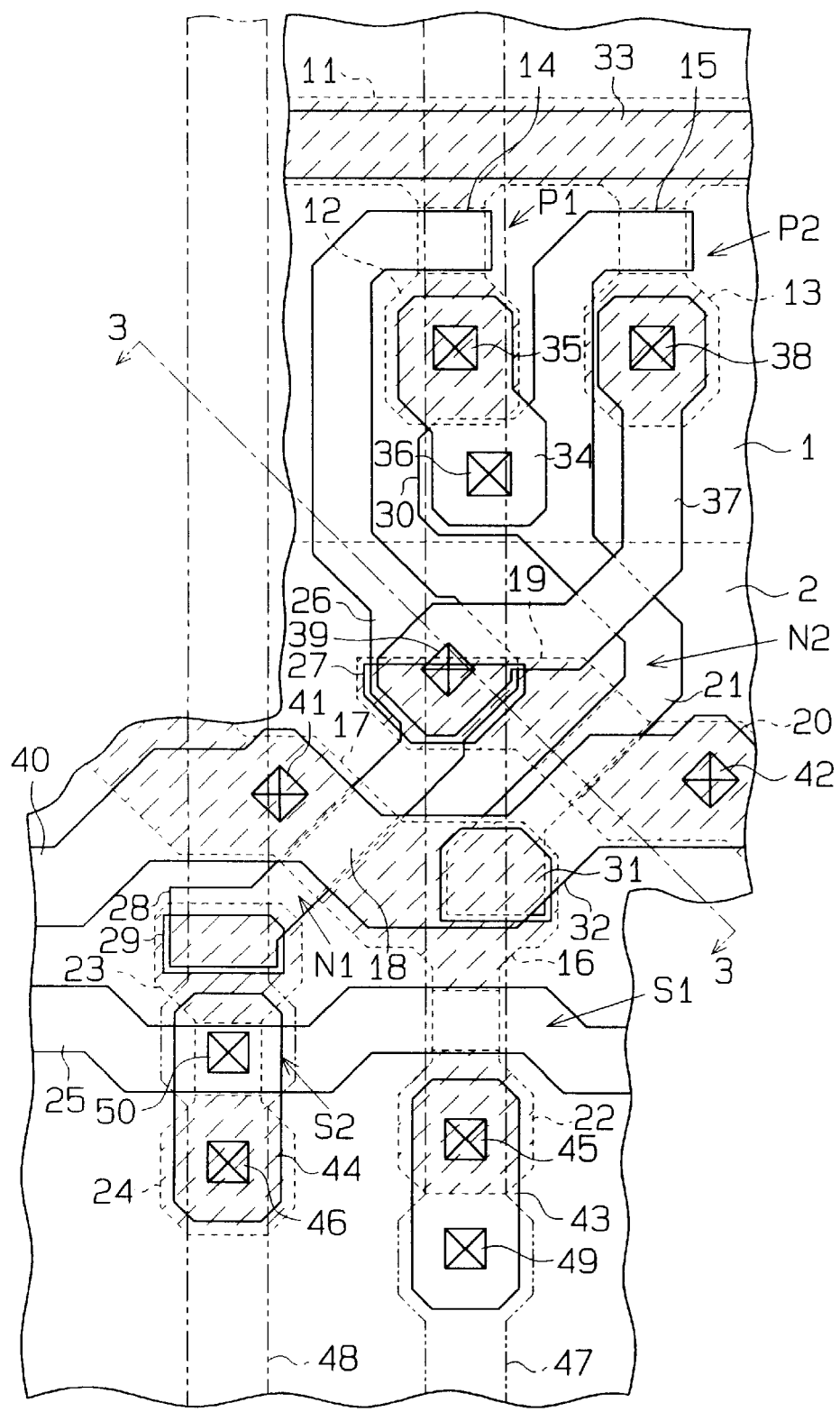
FIG. 2 is a plan view illustrating the structure of a conventional memory cell in an SRAM.

An SRAM according to a preferred embodiment of the invention will now be discussed with reference to the accompanying drawings. To avoid a redundant description, like or same reference numerals are given to those components that are like or the same as the corresponding components of the conventional SRAM of FIGS. 1–3.

Figure 4:
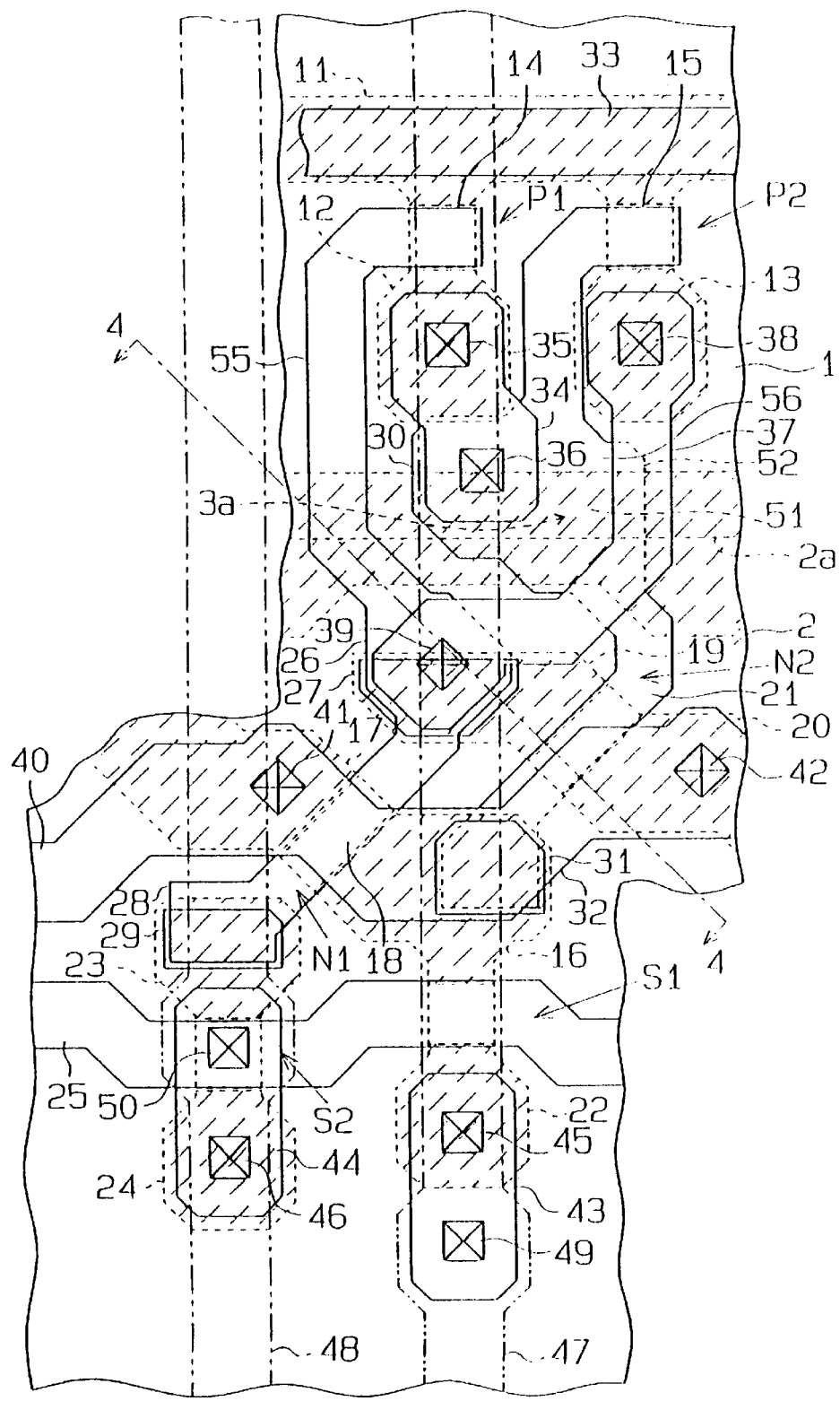
FIG. 4 is a plan view showing the structure of a memory cell in an SRAM according to an embodiment of the invention.
Figure 5:
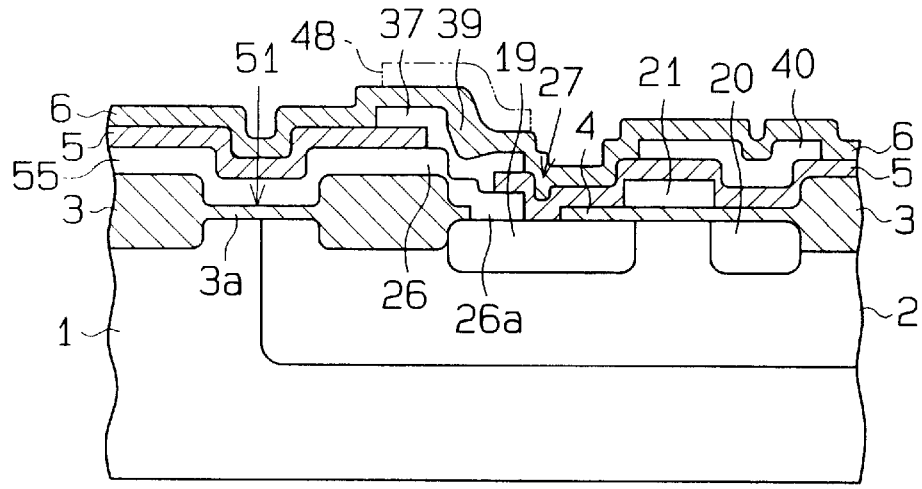
FIG. 5 is a cross-sectional view of the memory cell in FIG. 4 along the line 4—4.

FIG. 4 is a plan view showing the structure of a memory cell in an SRAM according to one embodiment of the invention. FIG. 5 is a cross-sectional view taken along the line 4—4 in FIG. 4, and FIG. 6 is a circuit diagram of the memory cell in FIG. 4.

According to the preferred and illustrated embodiment, as shown in FIGS. 4 and 5, an insulation film 3*a* is formed at the boundary between the N-type semiconductor substrate 1 and the P-well region 2. The insulation film 3*a* is thinner than the insulation film 3 located in the areas other than the boundary. The area where this thinner insulation film 3*a* is formed defines an active region 51. Located on the active region 51 are a part of a first conductive interconnection 55 (see FIG. 5) and a part of a second conductive interconnection 56 (see FIG. 4).

The first conductive interconnection 55 is formed integrally with the first gate electrode 14 and the third gate electrode 18 to connect those gate electrodes 14 and 18 together. The second conductive interconnection 56 is formed integrally with the second gate electrode 15 and the fourth gate electrode 21 to connect those gate electrodes 15 and 21 together. The thin insulation film 3*a* allows the first and second conductive interconnections 55 and 56 and the surface of the semiconductor substrate 1 to be close to each other.

Figure 6:
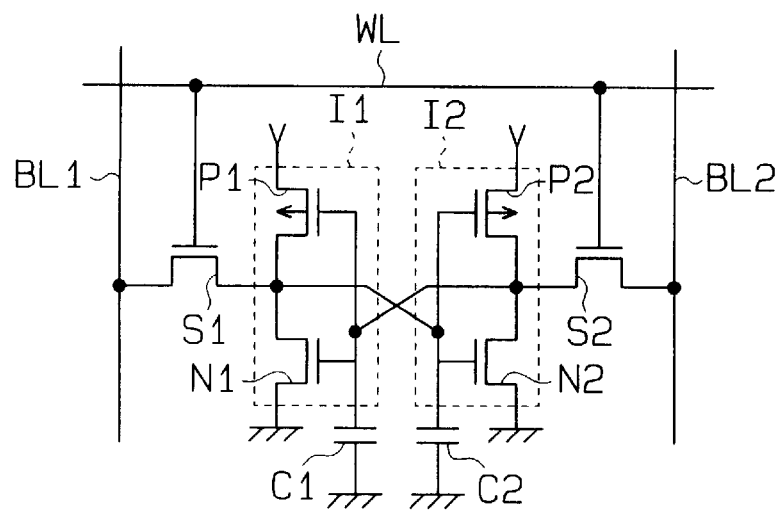
FIG. 6 is a circuit diagram of the memory cell in FIG. 4.

Therefore, a part of the first conductive interconnection 55, the thin insulation film 3*a*, and the semiconductor substrate 1 form a capacitor C1 (see FIG. 6). This capacitor C1 increases the capacitances of the gate electrode 14 of the memory node of the P channel MOS transistor P1 and the gate electrode 18 of the N channel MOS transistor N1. Further, a part of the second conductive interconnection 56, the thin insulation film 3*a* and the semiconductor substrate 1 form a capacitor C2. This capacitor C2 increases the capacitances of the gate electrode 15 of the P channel MOS transistor P2 and the gate electrode 21 of the N channel MOS transistor N2. This effectively stabilizes the potentials at the memory nodes and prevents the occurrence of a soft error as much as possible.

The thin insulation film 3a is formed at the boundary 2a between the N-type semiconductor substrate 1 and the P-well region 2, or on the area excluding the device forming region. The formation of the thin insulation film 3a does not increase the area of each memory cell.

The thin insulation film 3a is preferably formed at the same time as the insulation film 3 in the selective oxidization step. That is, the thin insulation film 3a is formed selectively at the boundary portion by using an oxide mask with a pattern different from that of the insulation film 3.

According to the preferred and illustrated embodiment, a part 52 of the second conductive interconnection 56, most of which lies over the active area 51, has a relatively large area. Thus, the capacitor C2 has a larger capacitance than the capacitor C1. The capacitor C2 is formed by the part 52 of the second conductive interconnection 56, the thin insulation film 3a, and the semiconductor substrate 1. This capacitor C2 therefore serves as an auxiliary capacitor to further increase the capacitances of the gate electrode 15 of the P channel MOS transistor P2 and the gate electrode. 21 of the N channel MOS transistor N2.

A part 52 of the second conductive interconnection 56 is formed at the boundary 2a between the N-type semiconductor substrate 1 and the P-well region 2, or in the area excluding the device forming region. Therefore, the area of each memory cell is not increased to form the auxiliary capacitance.

The capacitance of the capacitor C2 alone is increased for the following two reasons.

(1) A plurality of memory cells, though not illustrated, are located densely in rows extending the direction of the word lines. Between adjoining memory cells, the first conductive interconnection 55 of the first memory cell and the second conductive interconnection 56 of the second memory cell are located close to each other. This therefore prevents a part of the first conductive interconnection 55 and a part of the second conductive interconnection 56 from both having large areas. Accordingly, only the capacitance of the capacitor C2 is increased in consideration of the balance among the capacitances of the first to fourth gate electrodes 14, 15, 18 and 21.

(2) The buried contacts formed over the semiconductor substrate 1 cause the first to fourth gate electrodes 14, 15, 18 and 21 to have contact capacitances. For example, the gate capacitance of the first and third gate electrodes 14 and 18, which are connected to two buried contacts, is larger than the gate capacitance of the second and fourth gate electrodes 15 and 21, which are connected to one buried contact. To compensate for the difference between the gate capacitances, the capacitor C2 is given a larger capacitance than that of the capacitor C1. This capacitance adjustment permits the capacitors C1 and C2 to be equivalently connected to the respective gate electrodes, or the respective memory nodes of the inverters I1 and I2.

Although only one embodiment of the present invention has been described herein, it should be apparent to those skilled in the art that the present invention may be embodied in many other specific forms without departing from the spirit or scope of the invention. Therefore, the present example and embodiment is to be considered as illustrative and not restrictive and the invention is not to be limited to the details given herein, but may be modified within the scope and equivalence of the appended claims.

What is claimed is:

1. A static semiconductor memory device for receiving power from a first power line and a second power line located apart from each other, said device comprising:

a semiconductor substrate;

first and second load transistors located over said semiconductor substrate parallel to each other, along said first power line and connected to said first power line, each of said first and second load transistors having a gate and a drain;

first and second drive transistors located over said semiconductor substrate parallel to each other, along said second power line and connected to said second power line, each of said first and second drive transistors having a gate and a drain;

a pair of bit lines crossing said first and second power lines and running substantially parallel to each other;

first and second select transistors respectively connected to said pair of bit lines, each of said first and second select transistors having a drain;

a first connection line for commonly connecting said gate of said first load transistor and said gate of said first drive transistor to said drains of said second load transistor, said second drive transistor and said first select transistor;

a second connection line for commonly connecting said gate of said second load transistor and said gate of said second drive transistor to said drains of said first load transistor, said first drive transistor and said second select transistor; and a capacitor connected between either of said first connection line or said second connection line and said semiconductor substrate.

2. The semiconductor memory device according to claim 1, wherein said semiconductor substrate has a first region having a first conductivity and a second region having a second conductivity, said first and second load transistors being located over said first region, said first and second drive transistors being located over said second region, and said capacitor being located at a boundary between said first region and said second region.

3. The semiconductor memory device according to claim 1, further comprising an insulation layer provided between said semiconductor substrate and at least one of said first and second connection lines, said capacitor being formed by said semiconductor substrate, said insulation layer and at least one of said first and second connection lines.

4. The semiconductor memory device according to claim 3, wherein said insulation layer has a first thickness sufficient for at least one of said first and second connection lines, and for the surface of said semiconductor substrate, to be close enough to each other to define said capacitor.

5. The semiconductor memory device according to claim 4, wherein said insulation layer has a second thickness greater than said first thickness, said second thickness being located away from said first and second connection lines.

* * * * *